United States Patent [19]
Hansen

[11] Patent Number: 5,725,347
[45] Date of Patent: Mar. 10, 1998

[54] CAROUSEL PIN STACKER

[75] Inventor: Mark Hansen, Orange County, N.Y.

[73] Assignee: International Business Machines Corporation, Armonk, N.Y.

[21] Appl. No.: 651,192

[22] Filed: May 17, 1996

[51] Int. Cl.$^6$ .................................................. B65H 39/065
[52] U.S. Cl. .......................... 414/223; 414/222; 414/225; 414/786; 29/785; 29/786
[58] Field of Search ............................... 414/222, 223, 414/225, 795.8, 786; 29/771, 785, 786, 709

[56] References Cited

U.S. PATENT DOCUMENTS

| | | | |
|---|---|---|---|
| 3,553,815 | 1/1971 | McElvy | 29/786 |
| 4,113,083 | 9/1978 | Friese et al. | 414/222 |
| 4,886,592 | 12/1989 | Anderle et al. | 414/223 |
| 4,921,397 | 5/1990 | Watanabe | 414/223 |
| 4,969,790 | 11/1990 | Petz et al. | 414/222 |
| 5,174,067 | 12/1992 | Hasegawa et al. | 414/222 |
| 5,232,505 | 8/1993 | Novak et al. | 414/222 |
| 5,247,733 | 9/1993 | Kubota et al. | 29/785 |
| 5,310,039 | 5/1994 | Butera et al. | 414/225 |
| 5,451,130 | 9/1995 | Kempf | 414/225 |
| 5,549,444 | 8/1996 | Dubuit | 414/941 |

Primary Examiner—Karen B. Merritt
Assistant Examiner—Douglas Hess
Attorney, Agent, or Firm—Whitham, Curtis, Whitham & McGinn; Aziz M. Ahsan

[57] ABSTRACT

Automation of stacking of lamina included in a modular circuit package is provided by use of a plurality of heads carried on a preferably rotating head transport assembly. The head transport assembly is movable between two locations in which heads simultaneously brought to respective supply, alignment and disposal stations alternately pick up or deposit lamina, plates, separator sheets or protective sheets, respectively. Each lamina, sheet or plate deposited at the alignment station is pressed down over elongated alignment pins while maintaining only a short protrusion of the alignment pins above the existing stack. Continuous production is provided by carousels which bring alignment fixtures to the alignment station and magazines containing lamina to the supply station. Selection among lamina is provided by an elevator assembly which moves a magazine to a location at which a desired lamina can be selected therefrom, preferably under computerized control. The capacities of the alignment fixtures, magazines, carousels and supply stations support production of a plurality of stacks of lamina on an alignment fixture and continuous production of a plurality of production runs without resupplying the apparatus with lamina or plates.

22 Claims, 9 Drawing Sheets

CAROUSEL PIN STACKER

BACKGROUND OF THE INVENTION

1. Field of the Invention

The present invention generally relates to the manufacture of modular electronic circuits and, more particularly, the automated manufacture of multi-layer modules (MLM), especially multi-layer ceramic modules (MLC).

2. Description of the Prior Art

In electronic circuits and high-speed logic circuitry, in particular, reduction in size and increase in integration and packaging density has yielded substantial performance improvements due to reduced signal propagation time over shorter paths and increased noise immunity due to reduced capacitive and inductive coupling to conductors and other effects. For this purpose, modular circuits have been in use for several years to allow connection of numerous integrated circuit chips of diverse types and formed by different and potentially incompatible technologies within a single, compact package. Modular circuits also provide advantages of improved heat dissipation, regulation of temperature among chips, stability and protection for complex connection arrangements which are embedded therein and the possibility of electrostatic shielding being incorporated into the design.

Modular circuits are formed by a plurality of lamina, each having a conductive pattern formed on one or both sides and perforations, known as vias, filled with conductive material for making connections between lamina. Generally, the conductive patterns and filling of vias is performed by screening of conductive paste through a mask using specially designed machinery. Each conductive pattern will generally be unique for each lamina of a modular circuit. The lamina are individually placed in a stack and carefully aligned with previously placed lamina. Once assembled and aligned, the lamina are joined by known methods into a unitary body such as by sintering of uncured ceramic lamina, known as green sheets, or fusing or bonding of thermoplastic lamina.

Such modular circuits may be extremely complex and require hundreds of sequentially performed processes (with testing and repair between at least small groups of steps) to produce. For example, the lamina may be punched to form an array of vias, screening is done to fill vias and form conductive patterns (implying that a production run for each unique pattern will be performed for each required pattern forming a plurality of identical lamina to be eventually be placed in each of a like plurality of modular circuits), a covering to protect the pattern and avoid contamination applied to each lamina, selection and ordering of the lamina, removal of the covering, placement and alignment of the lamina and joining of the lamina.

Most of the sequentially performed process steps subsequent to the screening process must be performed manually due to the requirement for extremely high alignment accuracy and only small groups of steps have, to date, been automated. In spite of the substantial expense of such labor intensive processes, the performance of modular circuits often justifies the expense since no reasonable alternatives providing comparable performance and manufacturing flexibility and reliability are available.

The manufacturing process is further complicated by the need for avoidance of contamination of the lamina while being stacked together and the number of unique lamina which must be stacked together in a usually critical order to form the desired connection paths which will be embedded in the final modular circuit. While so-called clean rooms are well-known and utilized in many critical manufacturing processes, such clean rooms are expensive to build and maintain. Further, the presence of personnel represents an unavoidable source of contamination, as do the activities carried out in such an environment. Similarly, the possibility of human error in assembly (e.g. lamina order or alignment during assembly of the lamina stacks) is also unavoidable. While the possibility of repair (known as an engineering change or, simply, EC) of modules which may fail tests performed during the course of manufacture exists and is also provided for in the design of lamina, a gross error in lamina order or alignment is unlikely to be repairable; adding to the cost of functional modules produced.

It has also been the trend in electronic devices that once a new technology has been introduced and experience gained with manufacturing and design of circuitry using that technology, the technology is applied to other more economically accessible devices. The increased performance and functionality provided by the new technology increases demand for application of the technology to an increased variety and quantity of products. By the same token, the increased experience with design and manufacturing processes tends to increase manufacturing yield and reduce cost of exploiting the new technology in a wide variety of products.

However, both the compromise of the manufacturing yield and labor costs attributable to extensive human intervention in the manufacturing process for modular circuit packages has prevented sufficient reduction in cost of modular circuits for widespread use of modular circuits at the present time. Further, production volume is far too limited at the present time to satisfy demand which would accompany use of modular circuits in a wide variety of products or even data processors usable as personal computers. Efforts to accomplish some degree of automation of the assembly process has not provided for any significant increase in throughput since all parts of the assembly process must be not only automated but integrated in order to provide for a continuous assembly and to achieve the needed increase of production.

It has similarly been a trend in microelectronics that, as a technology matures, complexity increases within that technology until another technology is found which overcomes that complexity. While modular circuits at the present time generally include from five to nine lamina, it is foreseeable that modular circuits will soon be designed having much greater numbers of lamina. This projection or expectancy also presents difficulty for automation of significant portions of the assembly process since the design and fabrication of machines for automation of the assembly process is very costly and such a machine might quickly become obsolete if larger numbers of lamina in a single modular circuit package could not be accommodated. Likewise and/or alternatively, it is foreseeable that modular circuit packages could be increased in chip mounting area to accommodate foreseeable increased complexity, as well, and there is a trade-off between the cost of larger apparatus for automation of an assembly process which would accommodate potentially larger modular circuits including the overhead expense of space to house a larger apparatus than currently necessary and the cost of a smaller apparatus which may become obsolete within its service lifetime.

As alluded to above, it is the general practice to make production runs of each of a plurality of lamina for each required pattern in a modular circuit design and to store the lamina in accordance with the connection pattern formed thereon until the lamina are selected in an order specified by the design, placed in a stack, aligned and joined together into a unitary, modular structure. Therefore, division of the manufacturing process between the screening and assembly processes has been the general practice. However, since alignment has heretofore required manual performance and is inseparable from the selection and placement operations, it has not appeared feasible to automate this group of operations. Uncured ceramic green sheets are also very delicate and subject to damage during placement and alignment and such delicacy has hindered efforts at automation of the assembly process.

Further, the number of operations in each of the selection and placement operations has complicated any attempts to automate any significant portion of the process. For example, once selection of a lamina suitable to the sequence in accordance with the design of the modular circuit has been made, a protective covering must be removed and disposed of. Then the surface must be cleaned of any contaminant particles which might reach a surface of the lamina while it is unprotected by covering before placement and alignment. Additionally, after alignment has been accomplished and assembly is complete, storage until the lamina can be joined has proven difficult and to require substantial space, as well as further precautions against contamination of exposed surfaces.

SUMMARY OF THE INVENTION

It is therefore an object of the present invention to provide automation of the assembly of modular circuit packages including ordering, cleaning, placement and alignment of lamina.

It is another object of the present invention to provide for efficient handling and storage of a plurality of lamina assemblies.

It is a further object of the invention to provide an arrangement which will provide for continuous assembly of modular circuit packages.

It is yet another object of the invention to provide an arrangement which will provide for automation of the assembly of modular circuit packages while reducing the cost of maintaining a clean production environment and, at the same time, reducing the likelihood of lamina contamination during assembly.

It is a yet further object of the invention to provide an apparatus for automation of assembly of modular circuit packages which can accommodate a plurality of stacks of modular circuit package lamina appropriate to current modular circuit designs as well as a plurality of production runs and yet accommodate manufacture of modular circuit packages of increased numbers of lamina.

It is yet another object of the invention to provide a relatively inexpensive apparatus for automation of modular circuit package assembly which can be inexpensively modified to accommodate lamina of greater dimensions than currently in use.

It is another, further object of the invention to provide for reduced restriction on the working environment of personnel during assembly of modular circuit packages.

It is yet another, further object of the invention to provide a compact arrangement for automating assembly of modular circuits which can, nevertheless, accommodate the inclusion of many more lamina of substantially greater area than is currently the practice in modular circuit design.

In order to accomplish these and other objects of the invention, an apparatus for assembly of a stack of lamina is provided including first and second supply stations, an alignment station, a first further station, a head transport assembly carrying first, second and third heads at locations allowing simultaneous alignment of the heads with a respective one of the stations, and an arrangement for moving the head transport assembly and controlling the respective heads such that materials at the first supply station are alternately transported to the alignment station and the further station and material from the second supply station is transported to the alignment between transportation of material from the first supply station to the alignment station. While elongated alignment pins are provided on alignment fixtures for precise registration during automated stacking, the alignment station provides for maintaining only a short and constant protrusion of alignment pins above the stack while supporting the lamina stack along the alignment pins as each lamina is added.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
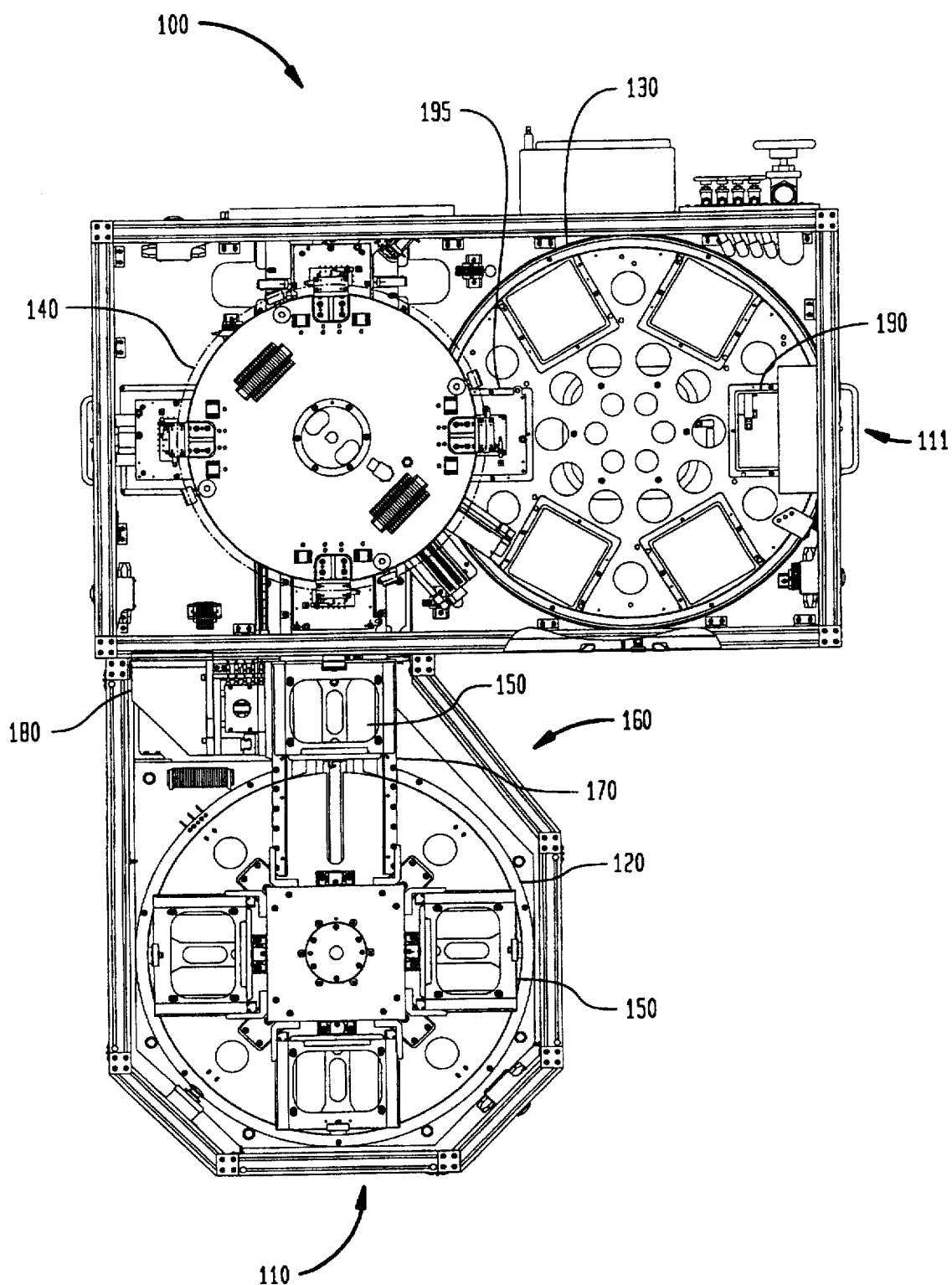
FIG. 1 is a perspective view of a presently preferred form of the apparatus in accordance with the invention.
Figure 2:
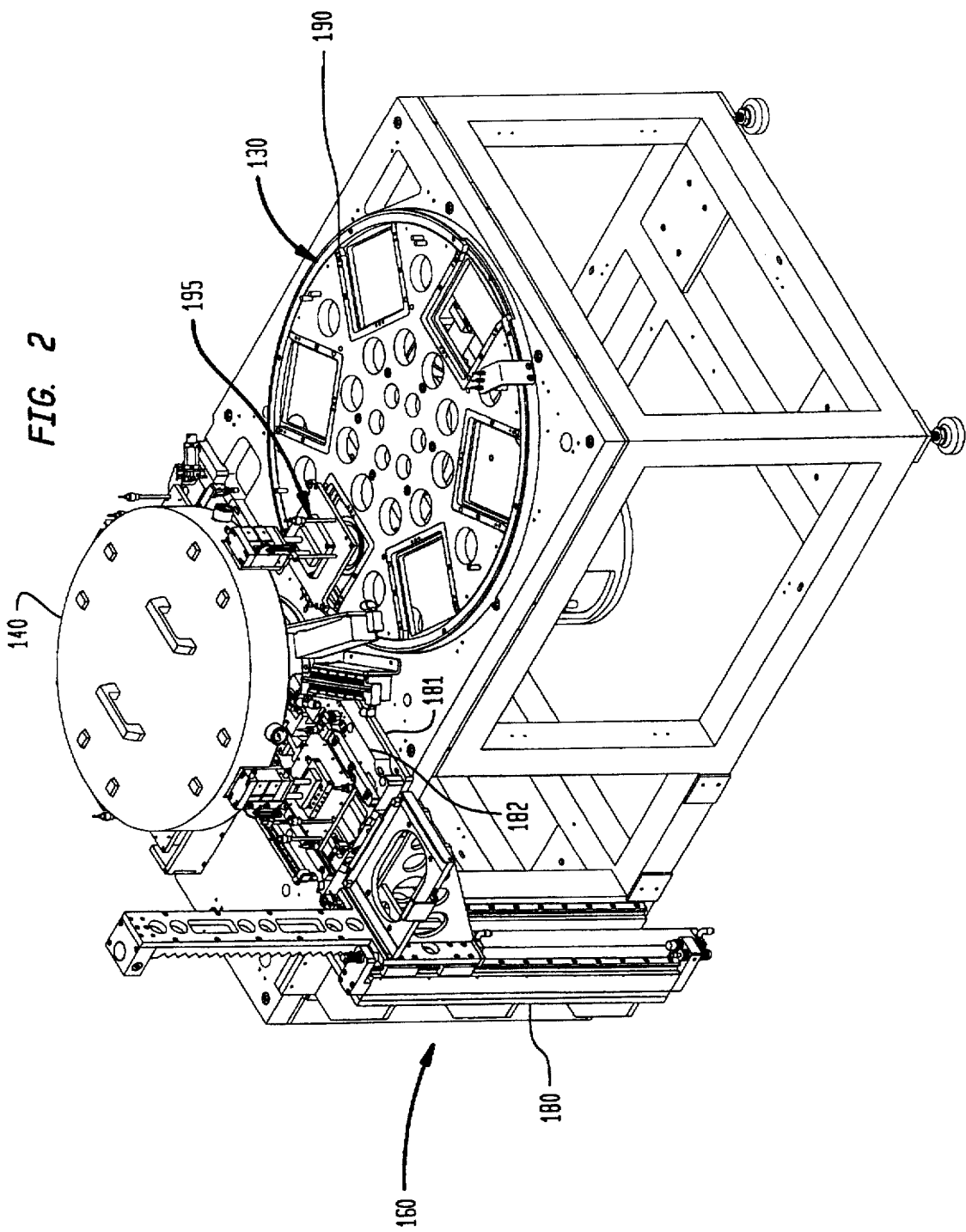
FIGS. 2 and 3 are isometric views of respective forms of the apparatus in accordance with the invention.
Figure 3:
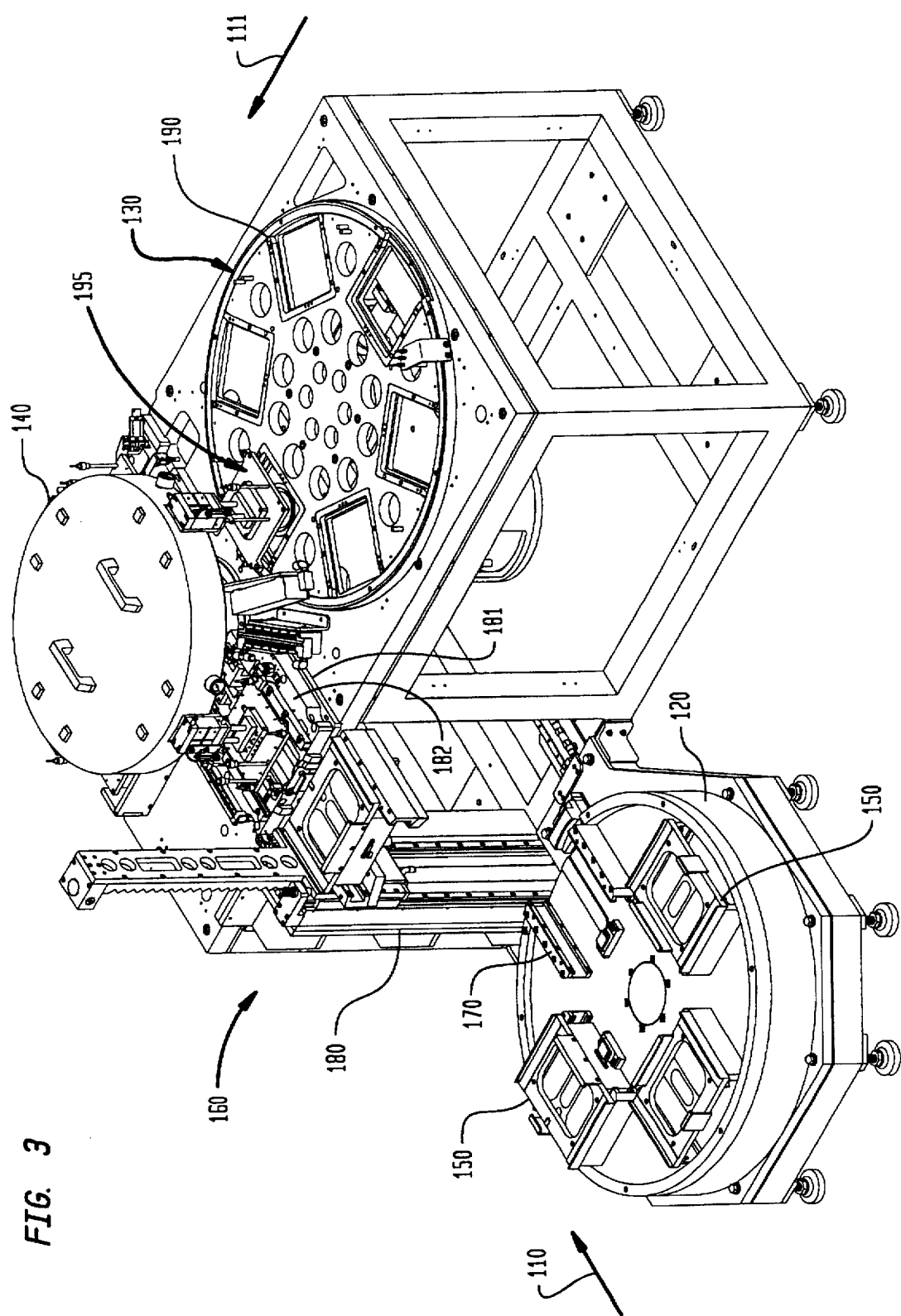

Referring now to the drawings, and more particularly to FIGS. 1–3, there is shown, in plan view in FIG. 1 and perspective view in FIGS. 2 and 3, the preferred layout of an arrangement 100 for automating assembly of modular circuit packages in accordance with the invention. In general, as most clearly seen in the plan view of FIG. 1, the preferred form of the invention is laid out in two paths 110, 111 at a 90° angle to each other. A carousel 120, 130 is located at each of the distal ends of the paths and a turntable 140 is placed at the juncture of the paths. (The term "carousel" will be used to connote unidirectional, though incremental, rotational movement and the term "turntable" will be used to connote bidirectional rotational movement, in the preferred case through only 90°, corresponding to the angle between the paths.) It should be understood that the layout of assembly 100 and motion of the carousels 120, 130 and turntable 140 are not critical to the practice of the invention but are, nevertheless, considered highly preferred and advantageous to the efficiency and simplicity of design of the invention, as will be discussed. In particular, the common movement of heads carried by head assembly 140, regardless of how such movement is achieved, allows high speed and efficiency of operation to be realized together with high positional precision of lamina transportation and assembly and removal of protective material.

It should also be understood that carousel 120, shown in FIG. 3 but omitted from the embodiment of the invention shown in FIG. 2, is not necessary to the practice of the invention for modular circuits of current designs but is, nevertheless, considered highly advantageous for continuous production and high throughput, at present, and potentially necessary for automated production of modular circuits having designs of increased complexity beyond that of current designs. Further, it is to be understood that while the present invention is considered particularly applicable to assembly of green sheets into multilayer ceramic (MLC) modules, with respect to which the invention will be discussed, the invention is not limited thereto but can be used to advantage with lamina formed of other materials and used to produce other devices which are assembled from such lamina where high alignment accuracy and freedom from contamination are important.

The path 110 beginning with carousel 120 supplies lamina to the apparatus and includes at least one magazine transport assembly 160 for transportation of a magazine (e.g. 150) containing a plurality of green sheets having necessary connection patterning in accordance with a particular modular circuit design. If carousel 120 is included, the magazine transport assembly 160 includes a portion 170 for horizontal transportation of a magazine from carousel 120 to a location at which green sheets are removed therefrom. In either embodiment of the invention, an elevator portion 180 is provided for moving a magazine 150 vertically in accordance with the particular green sheet type (e.g. connection pattern) to be selected.

In both embodiments, a further provision is preferably made for horizontal transport of a stack of green sheets from magazine 150 toward rotating head assembly 140 to a location at which they may be more readily accessed by one of the heads thereon without mechanical interference of a head (e.g. 605 of FIG. 6) and the magazine transport assembly 160. A preferred arrangement includes a track 181 and some suitable form of actuator to move a product tray 182, containing a stack of green sheets, from the magazine 150 to the location shown in FIGS. 2 or 3.

As noted above, carousel 120 is not necessary to the practice of the invention and can be omitted. However, inclusion of carousel 120 is advantageous to continuous production, high manufacturing yield and accommodation of more complex modular circuit designs since it can provide for plural magazines to be loaded into the apparatus at a single opening of a clean enclosure which will be described below for continuous supply of green sheets or, alternatively, provide for a much increased number of types of green sheets from which selection can be made, or both.

The path beginning (or terminating) with carousel 130 includes a plurality of alignment fixtures 190 and provides for a continuous supply of assembly trays on which MLCs are assembled from lamina and will hereinafter sometimes referred to as a tray feed assembly. The alignment fixtures cooperate with an alignment station 195 which provides for exact and reproducible alignment of the assembly trays with turntable 140 for stacking of the lamina. The alignment station 195 also provides for establishing a desired and favorable stacking hole pin depth, preferably about 0.040 inches, and seating of each green sheet against a previously stacked green sheet as it is assembled.

The actual assembly of green sheets into MLCs is performed by a plurality (preferably four) heads mounted on turntable 140, hereinafter sometimes referred to as a rotating head assembly. The respective heads mounted thereon, as will be discussed in more detail below, provide the respective functions of removing protective covering from the green sheets and disposing of the covering as the green sheets are selected, gripping of the green sheet and transporting it to an assembly location and picking up and transporting spacer sheets (2) and plates which allow plural MLCs of current design to be assembled on a single assembly tray and sintered or otherwise laminated concurrently subsequent to the operation of the invention. This important feature of the invention also allows production of circuit package designs having much increased numbers of lamina than are needed in current MLC designs but which future designs may require. All of these functions are provided by the preferred form of the invention in the course of a single bi-directional excursion of the rotating head assembly through an angle of 90°.

Before proceeding to a discussion of the details of the apparatus 100 of FIGS. 1–3, it is important to an appreciation of the invention that automation of the electronic module manufacturing process in accordance with the invention allows enclosure of the apparatus within an environment which may be readily, effectively and inexpensively maintained at an even higher level of freedom from workpiece contamination than a so-called clean room, in which the apparatus will generally be placed in service. Specifically, clean rooms require elaborate and expensive air flow and filtration systems to remove particles and volatile chemicals from the atmosphere and regulate air flow to a generally vertical direction in order to trap and/or remove particles and gases over the shortest possible path before such particles can settle on work pieces being processed by human workers therein or chemicals affect exposed material surfaces.

However, both machinery and human workers represent sources of contaminant particles and chemicals. While generation of particles by machines can be controlled to a substantial extent by placing covers and shrouds around moving parts, particles and vapors from human workers is much less readily controllable, even with special clothing and the like. Even movements of personnel can cause horizontal air currents which may dislodge particles from a surface and circulate them in the atmosphere. Therefore, separation of the environment of the manufacturing process to the extent possible from exposure to human workers will result in much reduced contamination of the articles manufactured.

Figure 4:
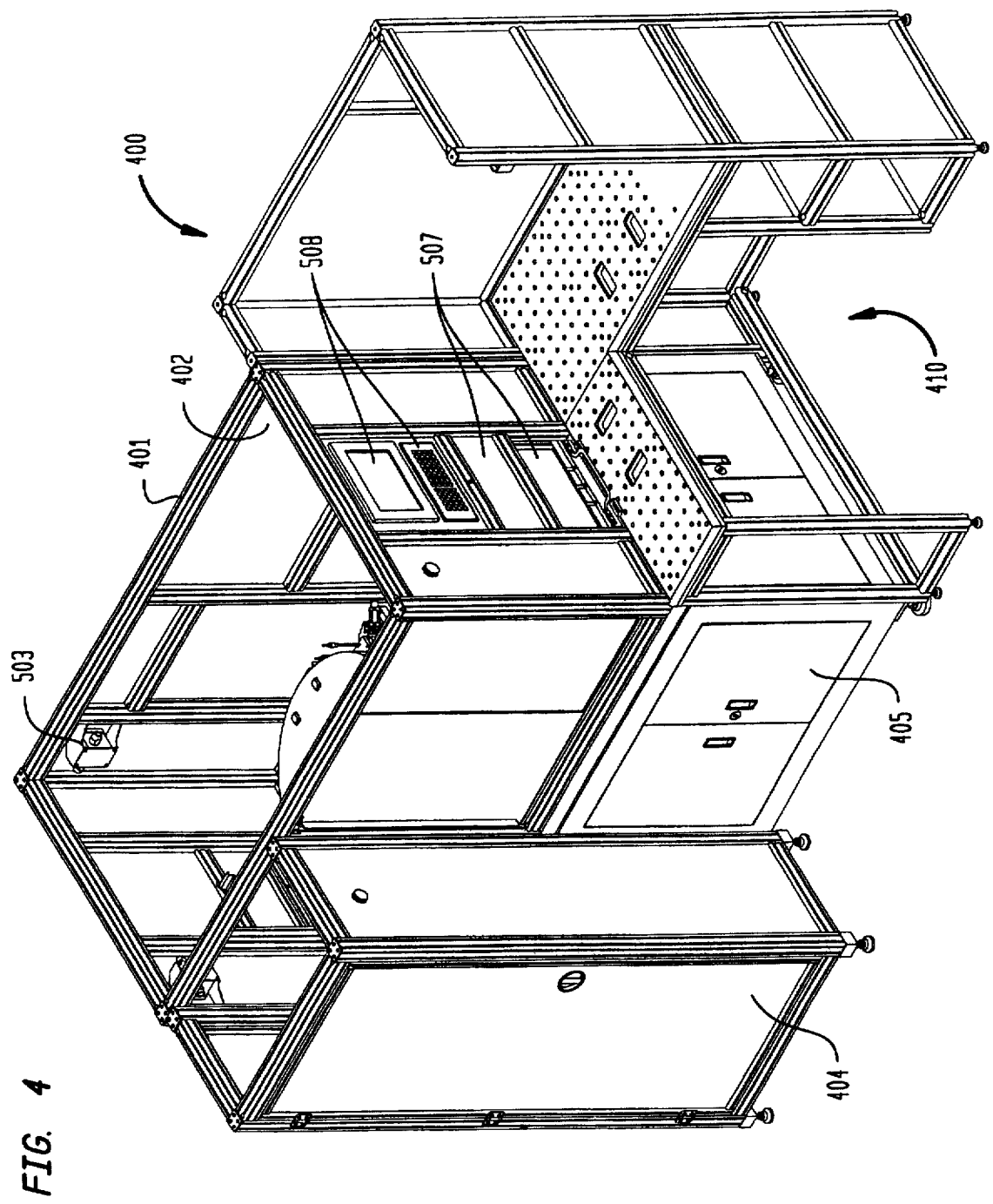
FIG. 4 is a perspective view of a housing for the apparatus of FIG. 2.
Figure 5:
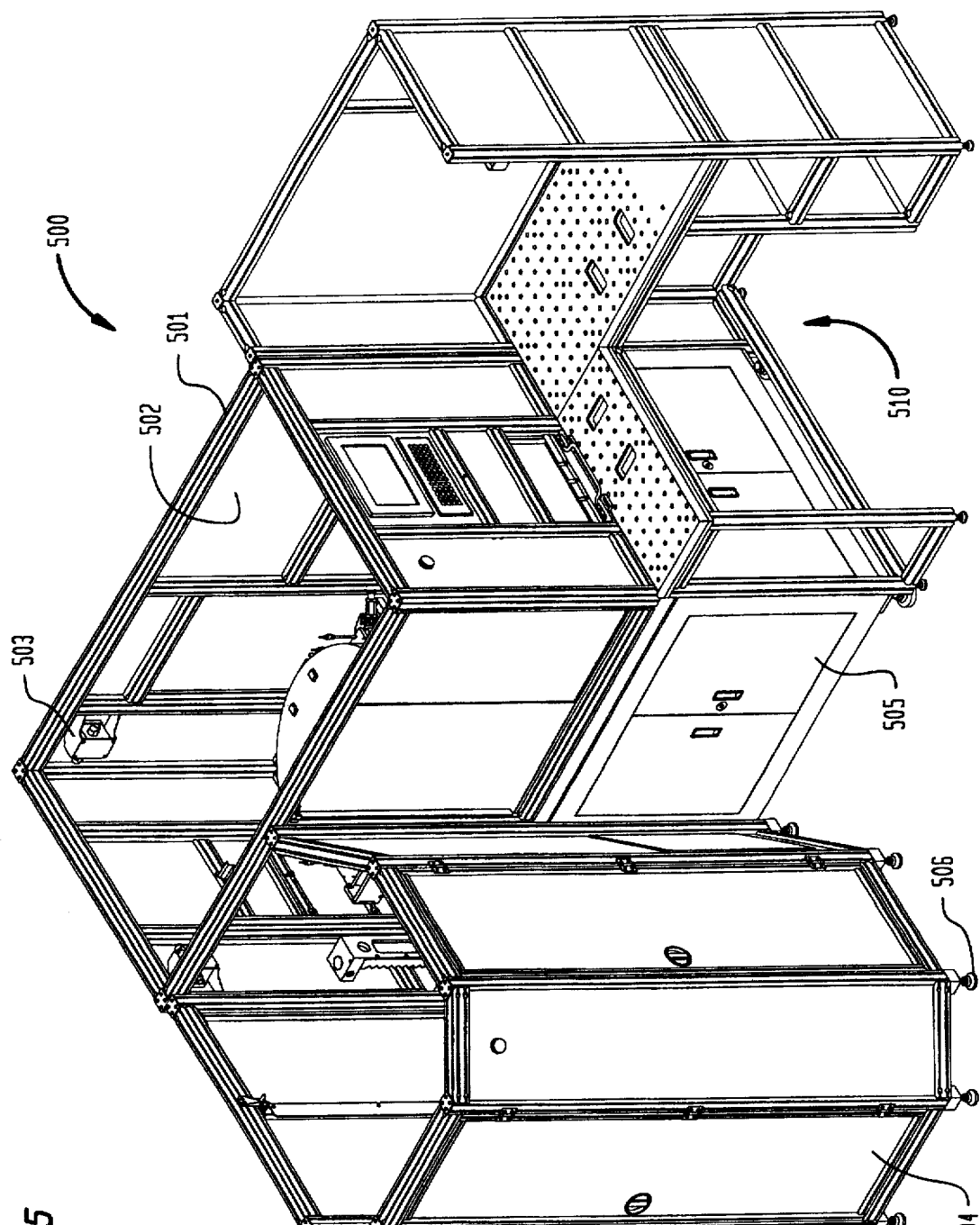
FIG. 5 is a perspective view of a housing for the apparatus of FIGS. 1 and 3.

Specifically, FIG. 4 shows a suitable enclosure 400 for the embodiment of the invention shown in FIG. 2 (e.g. without carousel 120). Similarly, FIG. 5 shows an enclosure 500 suitable for enclosure of the embodiment of the invention shown in FIG. 3. Both enclosures are formed of a framework of interconnecting elements 401, 501 such as formed tinplate or extruded aluminum which are arranged to interlock with each other or other pieces made for the joining thereof, details of which are not important to the invention. These elements are also preferably formed to support panels 402, 502 and access doors 404, 504 which may be of any suitable material, transparent, translucent or opaque, which are oriented vertically to prevent horizontal air currents within the enclosure. Accessories such as light fixtures 503 and storage cabinets (e.g. 405, 505) are also supported by the interlocked framework of elements 401, 501. The panels extend as closely as is practical toward the floor and ceiling and the air currents developed by the clean room environment, itself, will be much more effective at removing particles and gases within the enclosure and separated from human workers. It is preferred to compensate for floor irregularities and adjust panel proximity to the floor with screw supports 506.

For access to the machine 100 under normal operation, doors 404, 504 provide access to elevator mechanism 180 of the embodiment of FIG. 2 or carousel 120 of the embodiment of FIG. 3, respectively. Additionally, enclosures 400, 500 include similar workstations 410, 510, contiguous with and sharing a common wall with a wall of the enclosure at the termination of path 111. Access to carousel 130 for inserting alignment plates at locations 190 thereon and removal of assembled stacks of green sheets is provided through closeable window 507. The apparatus 100 is preferably computer controlled and the manufacturing process monitored by computer; the keyboard and monitor 508 of which may be conveniently located above window 507. The remainder of the workstation 410, 510 is unimportant to the practice of the invention but the form shown is considered to be preferable.

Central to the arrangement and function of apparatus 100 is turntable 140, shown in plan view at a rest position in FIG. 6 and sometimes referred to hereinafter as a rotating head assembly or head transport assembly. Turntable 140 includes a circular base plate 610 pivotably mounted at and preferably driven from a central shaft 615. Plate 610 also advantageously carries pneumatic valve banks and pneumatic controllers 630, 640 for operation of the plurality of heads mounted thereon in order to simplify and reduce fatigue in connections necessary to control the various heads of the rotating head assembly. It should also be understood that rotation is considered to be a highly preferable arrangement for providing common motion of the heads, particularly when reciprocated as is also highly preferred. However, neither rotary motion nor reciprocation is indispensable to the practice of the invention and, for example, monodirectional rotation or reciprocating linear motion or other common motion of the heads could be used.

It is important to an understanding of the features of the invention which will now be explained with reference to FIGS. 6, 6A and 6B to note that four stationary processing stations 601-604 cooperate with three or four heads 605-608 mounted on the rotating head assembly or turntable 140. Each of these heads has a different and specific function. Specifically, green sheet pick-up head 605 is arranged to pick up a green sheet from a magazine 150 (FIG. 1) at a supply station 601 and transport it to the alignment station 602. Plate pick up head 606 performs a similar operation for separation plates between plate supply station 603 and alignment station 602. Spacer sheets used for protection of green sheets and inserted therebetween in magazine 150 or other type of product tray 182 (FIGS. 2 and 3), preferably useable together with magazine 150 to facilitate extraction from the magazine 150, are removed therefrom by spacer pick-up head 608 at the green sheet supply station 601 and transported for disposal at disposal station 604. A similar operation could be performed between stations 603 and 604 by head 607, if desired and a suitable head 607 provided.

Figure 6:
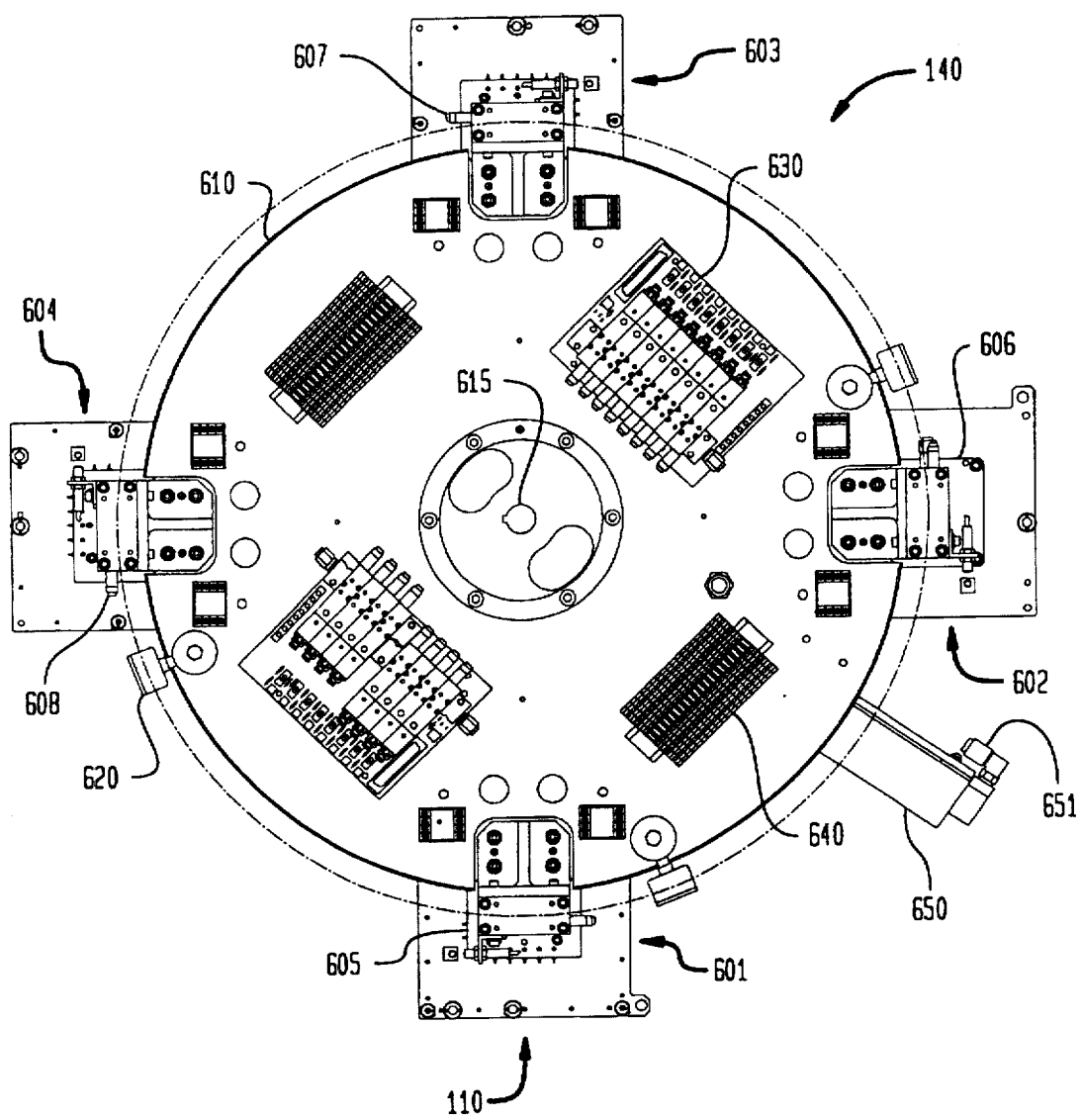
FIG. 6 is a plan view of turntable 140 at a rest position.
Figure 6A:
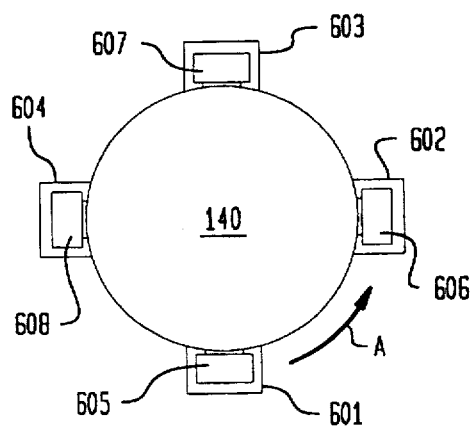
FIGS. 6A and 6B are schematic representations of the turntable of FIG. 6, also in plan view at both the rest position and an active, stacking position, respectively.
Figure 6B:
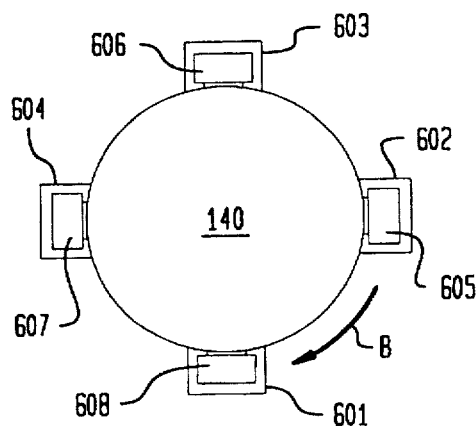

In FIGS. 6A and 6B, turntable/rotating head assembly 140 is schematically illustrated in the rest and active positions, respectively as dertermined at 620 of FIG. 6. The motion of the turntable 140 subsequent to head operations at these respective positions is shown by arrows A and B, respectively, whereby all heads are brought to the alternate positions at which each head performs another action, as may be required.

More specifically, when turntable 140 is at the rest position as shown in FIG. 6A, green sheet pick up head 605 picks up a green sheet at supply station 601 while plate pick up head 606 may deposit a separator plate at alignment station 602, as required, and, in any case, is available as a mandrel against which green sheets (and separator plates and mylar separator sheets, if used) may be pressed for relative slight downward movement of a lamina on alignment pins as will be described in more detail below and with reference to concurrently filed U.S. patent application Ser. No. 08/650, 078 (Attorney's Docket No. FI9-96-021), which is assigned to the assignee of the present invention and hereby fully incorporated by reference. Further, spacer pick up head 608 is in position to dispose of a protective spacer sheet at station 604 and, if provided, head 607 can pick up a similar sheet or other object at plate supply station 603 for transport to disposal station 604. It should be noted that each of these functions is either completed at the home position or begun at that position to be completed when the turntable 140 is rotated 90° (counter-clockwise, as illustrated in FIG. 6A) to an active position which will now be described.

When turntable 140 is rotated to an active position as shown schematically in FIG. 6B, green sheet/lamina pick up head 605 is in position to deposit a green sheet at an alignment station 602, plate pick up head is in a position at plate supply station 603 to pick up a separator plate from a stack of similar plates (provision of a six inch stack of ninety-six plates each 1/16 inch thick is preferred) raised by an actuator (not otherwise shown) as plates are removed therefrom, if a plate is needed, and spacer pickup head 608 is in position at product supply station 601 to pick up a protective spacer sheet from magazine 150 or product supply tray for return to disposal station 604 when turntable 140 is again rotated 90° in the opposite (clockwise as illustrated) direction to return to the rest position. If head 607 is provided and had picked up an object at plate supply station 603, it would be in a position to deposit it at station 604.

It should be noted that at the active position, heads 606 and 608 can pick up items at supply stations 601 and 603 while green sheet pick up head 605 deposits a green sheet at alignment station 602 (and, possibly, head 607 deposits an item at disposal station 604). Conversely, at the rest position heads 606 and 608 deposit separation plates and protective spacer sheets at alignment station 602 and disposal 604, respectively, while head 605 picks up a green sheet at green sheet supply station 601 from which the protective spacer sheet has been previously removed. Thus, when viewed from the standpoint of product supply station 601, a green sheet or a protective spacer sheet is picked up for each movement of turntable 140 and both are accomplished, transporting green sheets and protective spacer sheets in opposite directions in a single cycle of movement from the rest position to the active position and return. Similarly, viewed from alignment station 602, a green sheet is deposited and either a separator plate is deposited and/or the most recently deposited green sheet or mylar separator sheet pressed down in a similar single cycle of turntable movement from the rest position to the active position and return.

As a perfecting feature of the invention, while a green sheet is in transit between the home and rest positions, it is possible to further clean the green sheet by passing it adjacent an air supply nozzle 651 and vacuum arrangement 650. The pair of air nozzle and vacuum arrangement prevent particles dislodged from the green sheet from being placed into the environment atmosphere. Preferably such an air nozzle and vacuum arrangement are provided for each side of the green sheet.

While turntable 140 is in motion between positions (or before and/or after such motion, as may be needed), elevator arrangement 180 is activated to raise or lower magazine 150 to a position at which the next design of green sheet to be stacked is stored. In the embodiment of FIG. 3, a magazine which is in use may be lowered onto carousel 120 and carousel 120 rotated to present another magazine which is then lifted to a position required to access the next green sheet design.

Figure 7:
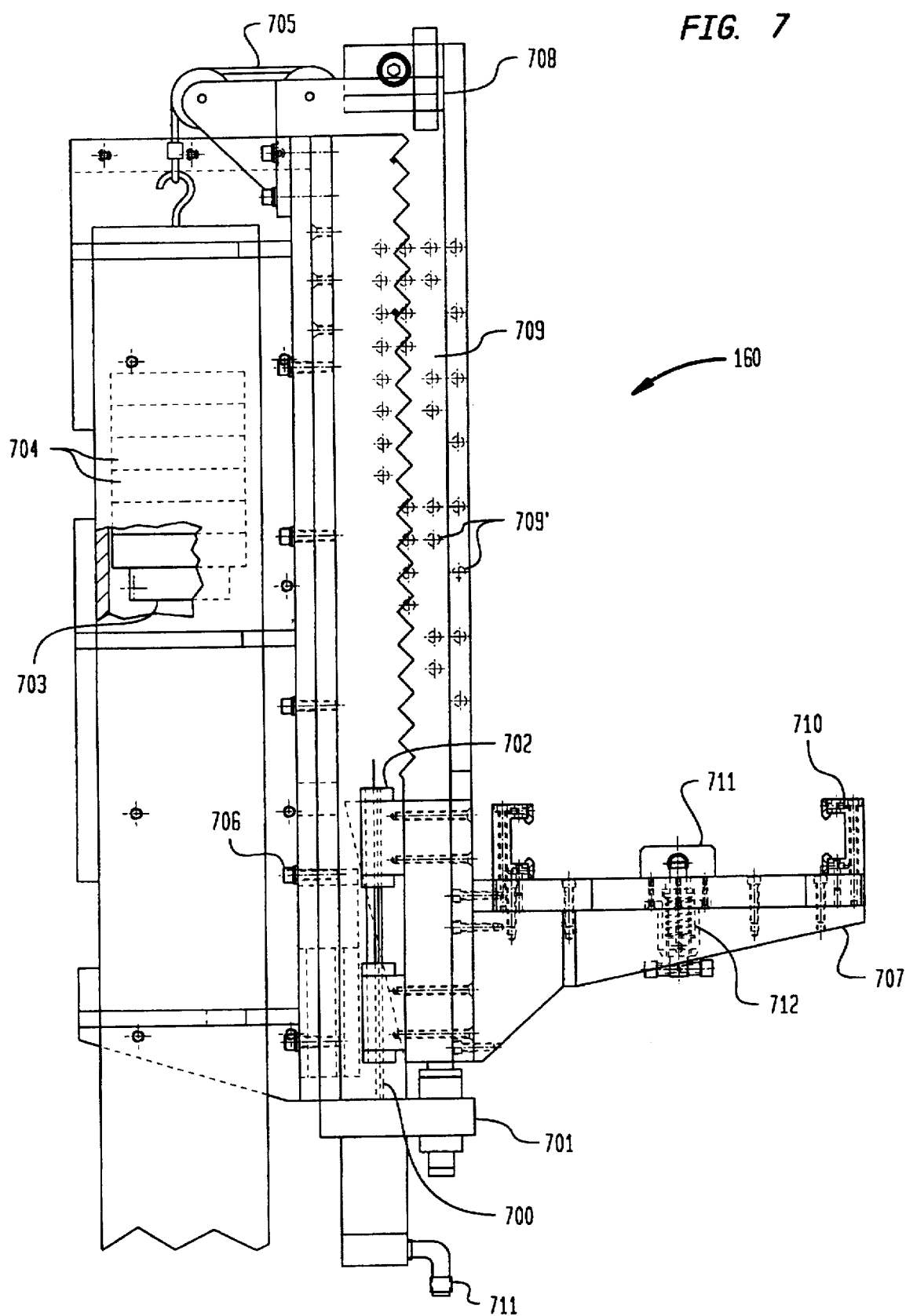
FIG. 7 is a side view of a magazine transport assembly in accordance with the invention.

A side view of the elevator assembly (viewed in the direction parallel to path 110) is shown in FIG. 7. Many of the details shown in FIG. 7 are not critical to the successful practice of the invention and alternatives will be apparent to those skilled in the art in view of the following description just as the function and interaction of many of the details illustrated will be readily apparent to those skilled in the art and detailed description thereof is unnecessary. However, the detailed illustration and the following description are provided as being presently preferred by the inventor.

Specifically, a track 700 is provided and supported by a stationary frame such as 701. A moveable elevator assembly includes bearings 702 which slidably engage track 700, preferably with bearings such as rollers, not shown, to prevent wear and reduce vibration and lost motion. A counter-weight system 703 including separate weights 704 and connected to the moveable elevator assembly at 706 by cable 705 which passes over pulleys at the top of the stationary frame 701, as shown. The counterweight assembly 703 is principally intended to balance the weight of magazine 150 including product trays 182 since the weight of green sheets and protective spacers as may be contained therein at any time will be substantially insignificant in comparison. Thus, movement of the elevator assembly will require little force and the particular actuator chosen is not important to the practice of the invention. However, a pneumatic actuator is preferred for ease of control, freedom from vibration, reduced wear and contaminant materials.

The elevator assembly preferably includes a cantilevered shelf 707 affixed thereto for supporting a magazine 150. The stationary frame 701 provides for mounting of proximity or position sensors 708, preferably of the optical or magnetic type which sense a grid of perforations or other detectable elements 709' in an element 709 carried by the elevator assembly. A pawl or detent engaging a preferably saw-toothed surface or edge of element 709 or another element prevents the magazine 150 from falling to the level of carousel 120 if power is interrupted. Thus it is preferred that the pawl or detent be spring biased into contact with the saw-toothed surface and withdrawn only when positively actuated.

The cantilevered shelf is also preferably provided with a pair of channels to engage a flanged bottom of a magazine 150 and securely hold it in a precise location during vertical motion. It is also preferred to provide a stop plate 711 to further insure correct positioning of a magazine 150, particularly when it is moved from carousel 120 to the elevator assembly including shelf 707 by operation of the embodiment of the invention illustrated in FIGS. 1 and 3. Similarly, it is preferred to provide a spring-loaded retractable pawl detent 712 to further secure the magazine 150 during vertical motion.

By virtue of the above described magazine transport assembly 160 a magazine can be lifted to bring a stack of green sheets, each protected by a spacer sheet to a vertical position corresponding to the heads carried by rotating head assembly 140. Preferably, as alluded to above, such a stack of green sheets is contained in a product tray 182 carried by the magazine 150 which can be moved from the magazine on tracks 181 to a location directly below a head carried by the rotating head assembly. In this way, mechanical interference between motion of the heads and motion of a magazine 150 is readily avoided.

The heads 605–608 (FIGS. 1–3 and 6) carried by rotating head assembly 140 are important to the invention to the extent that they must be suitable for securely gripping a green sheet (or other lamina which are to be stacked by the invention) while moving it with high precision to another location without causing any damage to the edges or surfaces (particularly conductive patterns thereon) of the green sheets. For this reason and the fact that magnetic and electrostatic pick-up arrangements may not be suitable for some features possibly included in modular circuit package designs, a vacuum manifold is preferably attached to commercially available pneumatic actuators to form the heads for contact with green sheets, plates, protective spacer sheets etc. Forces derived from vacuum manifolds for pick-up and pneumatic actuators are readily adjusted by air pressure supplied thereto and modulated in a well-understood manner to provide adequately gentle handling of the green sheets and other materials.

For example, in regard to the actuators, air pressure at about 40 psi. is preferably used and, given a green sheet area of about 50 square inches and a three-quarter inch piston, limits pressures applied to about eight ounces per square inch at the green sheet surface. Variations on the design of the vacuum manifolds will be apparent to those skilled in the art and should be provided in accordance with the particular functions to be achieved by each head.

From the foregoing, it is seen how green sheets are selected in a desired order by vertical movement of a (selected) magazine 150, protective spacers removed individually from each green sheet and disposed of and the green sheet picked up and transported to an alignment station 602 in accordance with path 110. It has also been demonstrated how separator plates can be picked up from station 603 and also brought to the alignment station 602 for stacking with the green sheets. By virtue of the use of separator plates, plural modular circuits can be assembled vertically and maintained in that configuration through a sintering process. This process provides for equalization and uniformity of compressive forces through the stack of modular circuits during the sintering process and also facilitates storage and transportation of a greater number of modular circuits prior to sintering since they are stacked one upon another. The throughput capacity of the sintering presses and other sintering equipment is similarly increased. However, the increased height of stacking presents another problem which is solved by the invention, as will now be described.

Specifically, if apertures on the green sheets are used for purposes of precise registration and alignment on pins (preferably four, corresponding to corners of the green sheet) provided on alignment trays during stacking, increased stack height requires an increased height of alignment pins. As the head 605 brings a green sheet to the alignment station and releases it in substantial registration with the alignment pins, the green sheet essentially settles on the alignment pins and its motion is well-described as free-falling or floating since it is not otherwise constrained.

If the alignment pins are elongated, the likelihood that the green sheet will assume a diagonal or sloping orientation on the alignment pins is greatly increased. Such an orientation causes forces to be applied to the alignment apertures on the green sheet and is likely to cause tearing thereof. Further, if the green sheets are not individually pressed together as they are assembled, the potential for contamination is increased and it is inevitable that air inclusions will result if the green sheets are only pressed together as a group. Further, and perhaps more importantly, if the green sheets are pressed together from an angled orientation, it is inevitable that some wiping motion of one green sheet against another will result, having the potential effect of smearing the fine pattern of conductive paste on the surface thereof, potentially causing massive shorting of conductors and, at a minimum, deforming the cross-sectional shapes of the conductors. These potential problems and others are solved by the alignment station, similar to that disclosed and claimed in the above incorporated, concurrently filed application, particularly when taken together with carousel 130 in path 111.

Figure 8:
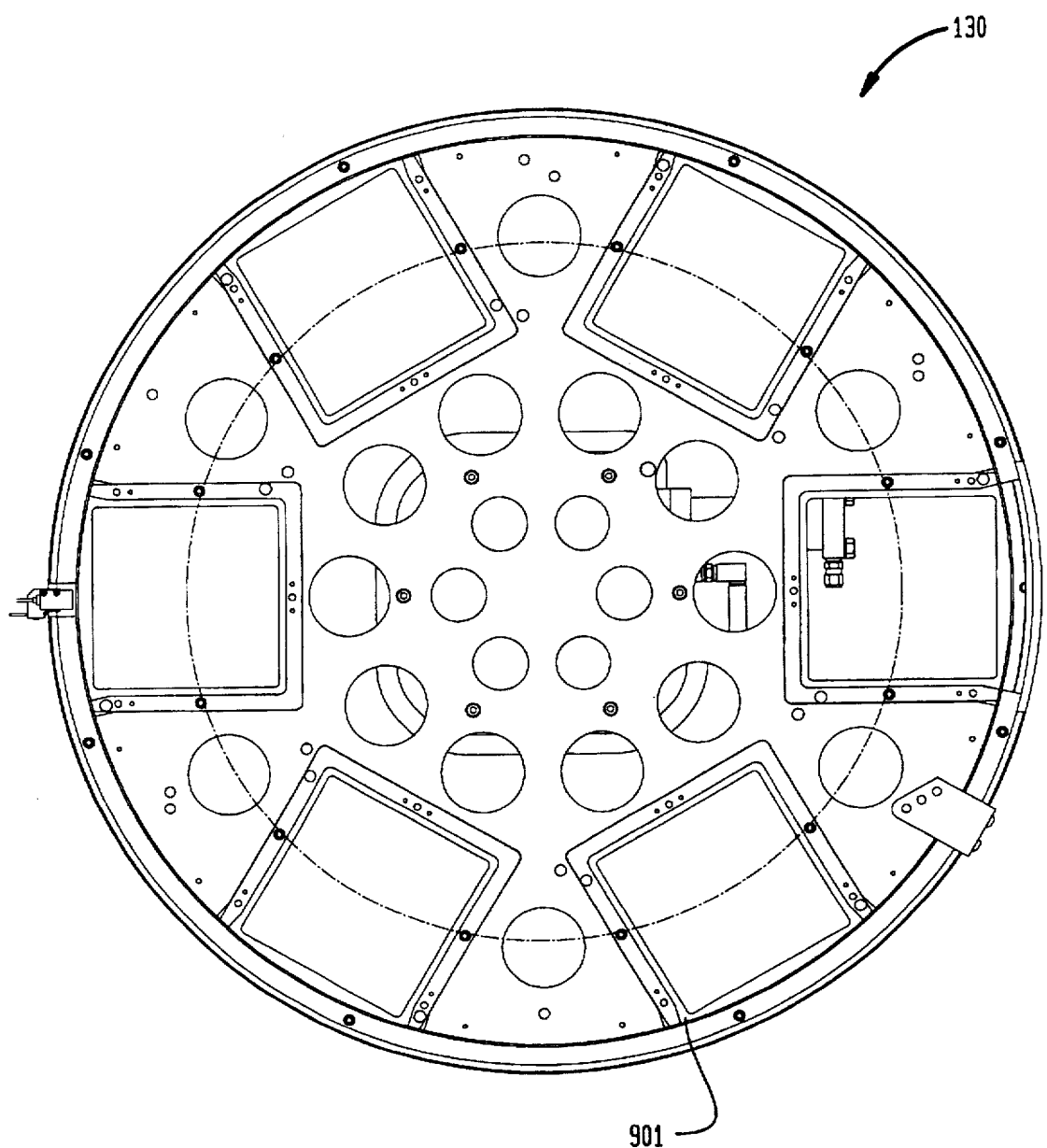
FIG. 8 is a plan view of an assembly tray carousel.
Figure 9:
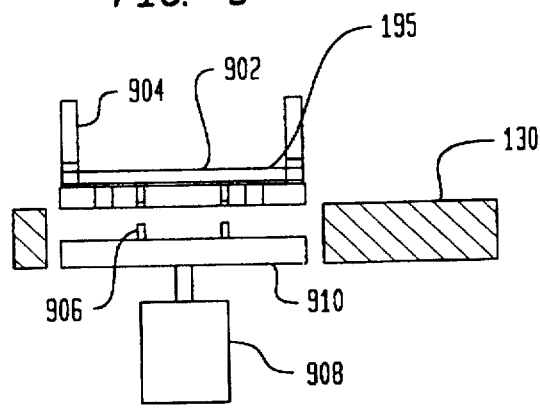
FIGS. 9, 10, 11 and 12 are schematic side views of salient portions of an alignment station at sequential stages of operation in accordance with the invention.

Specifically, carousel 130, shown in detailed plan view in FIG. 8, performs several functions. Most basically, the circumference of carousel 130 allows for a plurality of assembly trays with alignment pins to be provided and to be ready for stacking of green sheets, as needed, to provide for continuous production. The diameter of carousel 130 also provides for physical separation of the alignment station, where the green sheets are stacked, from the operator to reduce the likelihood of contamination. After stacking, carousel 130 also returns the stacked modules to the operator for removal and transfer to lamination press apparatus.

It should be noted, in this regard, that the size of fixtures 901 is determined in accordance with the physical transverse dimensions of a green sheet or other lamina and it is preferred to provide for six fixtures appropriate to lamina of currently preferred size (e.g. seven to eight inches on a side) on carousel 130 to provide suitable latitude for operator activity. Larger lamina could then be accommodated most inexpensively, if needed, by reducing the number of fixtures 901 on carousel 130 to four. Alternatively, and preferably, larger lamina could be accommodated at relatively low expense by increasing the diameter and circumference of carousel 130 to whatever size is required to hold six fittings 901 of corresponding dimensions.

Further, the fittings 901 for receiving assembly trays allow the operator to establish an initial alignment of the assembly trays which is further refined at the alignment station 602. Specifically, fittings 901 are preferably sized to provide an alignment accuracy of about 0.005 inches simply by inserting an assembly tray therein. Alternatively, micrometer-like screw adjustments could be provided but are not required. By allowing the operator to bring alignment within certain tolerances that can be accommodated by the alignment station, the invention can achieve extremely precise positioning of the assembly trays.

When the assembly tray reaches the alignment station, the alignment pins are gripped by a template, preferably provided by head 605 or 606, which can be placed over the tapered ends of the alignment pins or other mechanism and the latter brought to a precise location. Alternatively, robotic cams can be used to adjust alignment, as discussed in the above-incorporated patent application. The assembly tray is then preferably locked in this precise position by application of a vacuum to the underside thereof as discussed in the above-incorporated application. Fixture aligning pins 906 can also be used for either coarse or fine alignment.

Once precise positioning of an assembly tray is achieved, stacking of green sheets can begin.

The pressing of the green sheets together as each individual green sheet is added to the stack is achieved by a frictional linear clutch arrangement which is more specifically discussed in the above-incorporated U.S. patent application. But will be briefly discussed herein with reference to FIGS. 9-12 in the interest of completeness.

Essentially, when the stacking fixture 195 (FIG. 1) is brought to the alignment station 602 (FIG. 6), it will preferably have a stacker plate 902 already fitted over stacking pins 904 by holes sized to readily provide of movement of stacker plate 902 thereon. Top cylinder 908 then raises plate 910 to engage the alignment fixture 195 at the vertical position to which it is brought by the carousel 130 and fine alignment is carried out.

Figure 10:
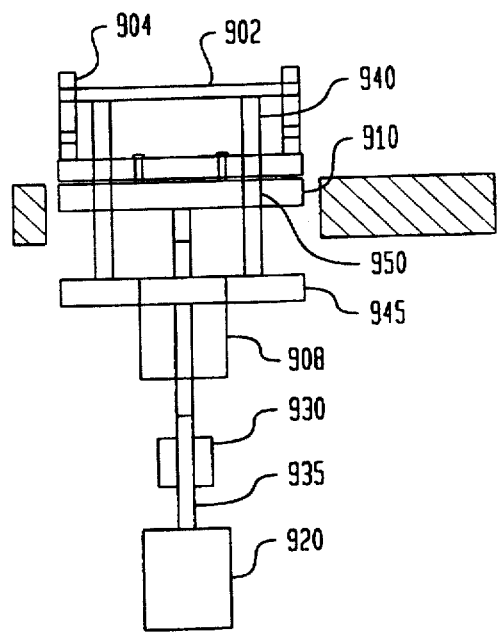

Referring now to FIG. 10, a middle cylinder 920 (omitted for clarity from FIG. 9) presses shaft 935 or other suitable linkage upward through a linear friction slip clutch 930 which, in turn, raises a platform 945 (which may be of annular form if needed for clearance from upper cylinder 908) to raise rods 940 through apertures 950 in plate 910 to lift stacker plate 902 to a position near the top (preferably proximate a tapered shoulder portion as discussed in the above-incorporated application) of alignment pins 904, effectively shortening the pins so that no significant diagonal positioning of the green sheet can occur to cause tearing or wiping action. The stacking plate is held at this location by friction slip clutch 930.

Figure 11:
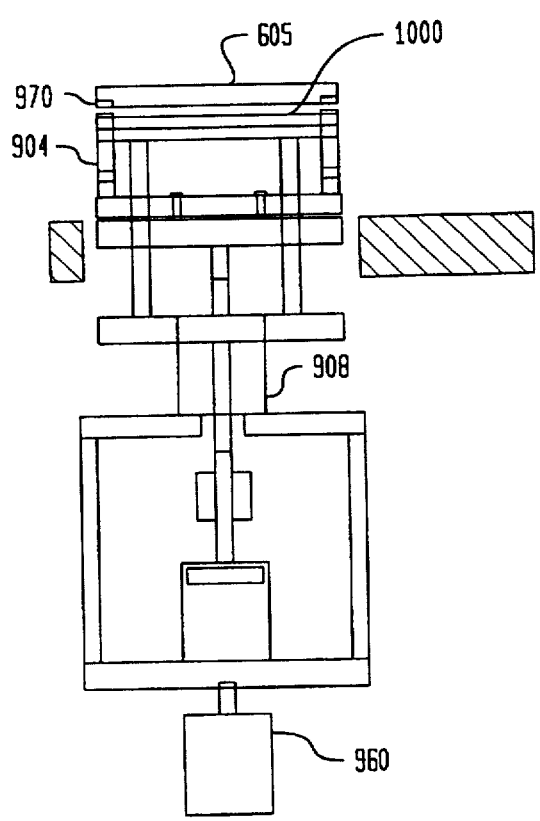
Figure 12:
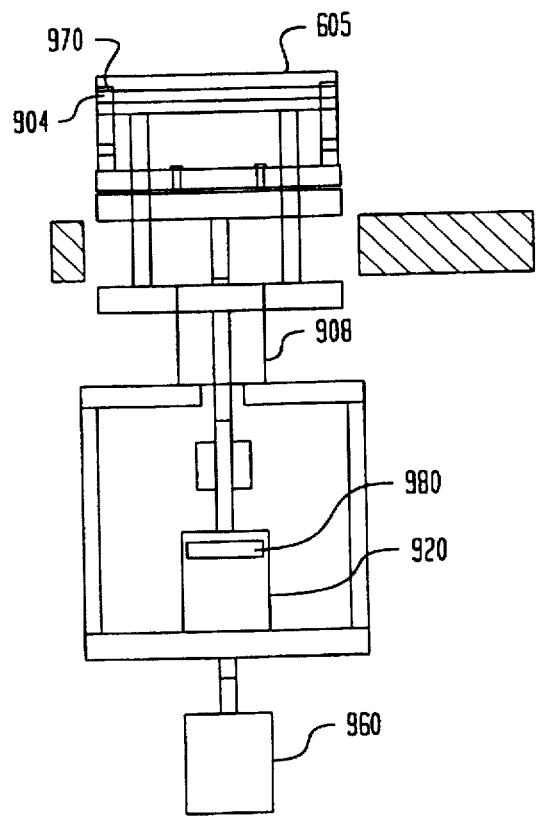

Then, as the rotating head assembly is rotated, head 605 brings a green sheet into substantial registration with the alignment pins 904 with a small clearance (preferably about 1/16 inch) above them. As shown in FIG. 11, the green sheet 1000 is then released and allowed to settle on the shoulder of the registration pins at the juncture of cylindrical and conical portions thereof, as discussed in the above incorporated patent application. The head 605 remains briefly in position above the alignment pins (or head 606 brought to that position) while the lower cylinder 960 raises the upper cylinder 908 and the stacking fixture including the alignment pins, as shown in FIG. 12. Head 605 or 606 may be allowed to have small horizontal motion to self-align alignment bushings 970 with alignment pins 904 during this operation as the alignment pins are raised together with the alignment fixture 195.

The most recently placed green sheet 1000 rises with the alignment pins until it contacts head 605 or 606 where it remains in fixed position while previously placed green sheets (or stacker plate or a separator plate) in the stack are raised against it, pressing all green sheets, separator plates and the stacker plate down the alignment pins against the action of the friction clutch 930. Thus when lower cylinder 960 is returned to the normal position, the most recently placed green sheet 1000 will assume the position previously occupied by the previously placed green sheet and the protrusion of alignment pins 904 above the stack will be precisely maintained. This operation can be repeated at will to the capacity of the alignment pins 904.

As the process is repeated, each subsequently stacked green sheet is evenly and gently pressed against a previously stacked green sheet or plate in the stack. Further, as each green sheet is added and pressed down by the head 605 or 606, support rods 940 will be pressed lower through friction clutches 930 by precisely the thickness of the added green sheet, as indicated with particular clarity by movement of exemplary piston 980 of middle cylinder 920. Thus, tearing of the green sheets by the alignment pins and wiping actions between green sheets is avoided while each green sheet is pressed against the stack as it is added in order to avoid air inclusions and to reduce the possibility of contamination.

After the required sequence of green sheets has been stacked, a separator plate can be added to the stack by head 606 (both preferably under data processor control) and the process can be repeated to form another module. (Mylar separator sheets are preferably added to the stack before and after each separator plate to prevent contact between a lamina and a plate.) It should be noted in this regard that plural stacks can be formed on the same stacking fixture 195 by separating them with separator plates supplied from plate supply station 603. In theory with the alignment station arrangement described above, there is no limit to the length of the alignment pins and the number of modules which can be assembled on a single assembly tray. However, in practice at the present time, it is preferred to limit the alignment pin height to about 0.85 inches as an incident of current lamination press dimensions and having nothing to do with the operation or successful practice of the invention or the alignment station thereof. Such a practical and conservative alignment pin height can accommodate about five to ten modular circuits of current design complexity, allowing a five -to ten-fold reduction in storage space and a five- to ten-fold increase on lamination press apparatus throughput. By the same token, a five- to ten-fold increase in complexity (in terms of number of green sheets required; the number of potential connections should increase exponentially) over current designs could be accommodated by the invention.

It should also be appreciated that the invention allows very rapid green sheet selection, removal of protective spacers, cleaning of particles during transport, registration and pressing of each green sheet as it is stacked in very rapid sequence, allowing several modular circuits to be assembled with high manufacturing yield in a time comparable to the manual alignment and placement of a single green sheet in a stack. Considering that the invention provides for continuous production of modular circuits and other laminated structures while reducing the likelihood of contamination in a much less labor intensive fashion, the throughput of the invention together with increased manufacturing yield is far greater than could be achieved manually. For purposes of comparison, at the present time the invention is capable of stacking one sheet every 6.8 seconds on a continuous production basis with much increased manufacturing yield over manual methods whereas manual placement of a single sheet would often exceed one minute. An operator need only use the time for the machine to stack 30–50 green sheets and separator plates (a few minutes) to remove a completed stack from carousel 130 and to replace the assembly tray/ stacking fixture 195 with an empty assembly tray.

In view of the foregoing, it is clearly seen that the invention provides for continuous automated production of multi-layered modular circuits including selection, cleaning placement and alignment of lamina while disposing of protective materials and providing stacking of plural such circuits for lamination, increasing efficiency of handling and storage as well as the lamination process itself. Manufacturing yield is increased and costs of maintaining an adequately clean environment while reducing contamination of lamina during the stacking process while reducing restriction on the working environment of a reduced number of assembly personnel. The apparatus also efficiently provides for accommodation of far more complex modular circuit designs than are currently in use while providing substantial manufacturing benefits as applied to current designs. The apparatus can also be readily and inexpensively modified to accommodate green sheets or lamina of any practical size.

Further, in view of the fact that a job run is generally on the order of twenty stacks, each of which can be diced into, for example, nine or twelve modular circuit packages, and the capacity of the machine for green sheets, separator plates and the like will accommodate production of eighty pieces or stacks, it can be seen that four job runs can be performed without reloading the machine, thus reducing the possibility of contamination to a very low level. When it is considered that a stack of lamina for a current modular circuit design will consist of five to ten sheets and that a stack, once laminated, will be diced into nine or twelve modular circuits, a stacking rate of 6.8 seconds per sheet in continuous production translates into an average production of a modular circuit every 3 to 7 seconds at extremely high production yield and under the control of a single operator. Therefore, it is clear that the invention provides for very high volume production particularly when the complexity and precision of the modular circuit package is considered. It is also worthy of note that while the apparatus according to the invention is complex, the tooling cost thereof is only 10%–15% of the tooling required to support manual assembly in accordance with known assembly methods.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An apparatus for assembly of a stack of lamina including
    a first supply station,
    a second supply station,
    an alignment station,
    a first further station,
    a head transport assembly carrying first, second and third heads at locations allowing simultaneous alignment of said first, second and third heads with a respective one of said first supply station, said second supply station, said alignment station, and said further station, and
    means for moving said head transport assembly and controlling said first, second and third heads such that materials at said first supply station are alternately transported to said alignment station and said further station and material from said second supply station is transported to said alignment station between operations for transport of material at said first supply station to said alignment station.

2. An apparatus as recited in claim 1, wherein said head transport assembly is rotatable about an axis.

3. An apparatus as recited in claim 1, further including
    a first carousel for transporting a supply of fixtures including registration pins to said alignment station.

4. An apparatus as recited in claim 3, further including
    means for aligning one of said fixtures at said alignment station.

5. An apparatus as recited in claim 4, wherein said means for aligning one of said fixtures at said alignment station includes a robotic cam.

6. An apparatus as recited in claim 4, wherein said means for aligning one of said fixtures at said alignment station includes alignment pins.

7. An apparatus as recited in claim 4, wherein said means for aligning one of said fixtures at said alignment station includes alignment bushings on one of said heads carried by said head transport arrangement.

8. An apparatus as recited in claim 4, wherein said alignment station includes a first means for moving a surface to engage an alignment fixture.

9. An apparatus as recited in claim 8, wherein said alignment station includes a second means for moving a plate movable on alignment pins of said alignment fixture to a location proximate a free end of said alignment pins.

10. An apparatus as recited in claim 9, wherein said alignment station includes a third means for raising said alignment fixture against one of said heads carried by said head transport assembly.

11. An apparatus as recited in claim 10, wherein said second means includes slip clutch means for supporting said plate and wherein said third means includes means for pressing said plate against friction of said slip clutch.

12. An apparatus as recited in claim 1, wherein said alignment station includes a first means for moving a surface to engage an alignment fixture.

13. An apparatus as recited in claim 12, wherein said alignment station includes a second means for moving a plate movable on alignment pins of said alignment fixture to a location proximate a free end of said alignment pins.

14. An apparatus as recited in claim 13, wherein said alignment station includes a third means for raising said alignment fixture against one of said heads carried by said head transport assembly.

15. An apparatus as recited in claim 14, wherein said second means includes slip clutch means for supporting said plate, and wherein said third means includes means for pressing said plate against friction of said slip clutch.

16. An apparatus as recited in claim 1, further including selection means for selecting a particular one of a plurality of lamina at said first supply station for transportation to said alignment station.

17. An apparatus as recited in claim 16, wherein said selection means includes a magazine for holding respective groups of lamina in accordance with said plurality of lamina, and means for moving said magazine relative to said head transport assembly.

18. An apparatus as recited in claim 17, wherein said magazine further includes a tray for containing a group of said lamina.

19. An apparatus as recited in claim 16, further including a carousel for moving a magazine to said means for moving said magazine relative to said head transport assembly.

20. An apparatus as recited in claim 1, wherein said material at said first supply station includes lamina with conductive patterns thereon and sheet means for protecting said conductive patterns and material at said second supply station includes separator plates.

21. A method of assembling a plurality of lamina from first and second supply stations on alignment pins of an alignment fixture at an alignment station, said method comprising the steps of moving first, second and third heads on a head transport assembly between first and second positions of said head transport assembly to simultaneously align said first, second and third heads with a respective one of said first supply station, said second supply station, said alignment station, and a further station, and controlling said first, second and third heads such that materials at said first supply station are alternately transported to said alignment station and said further station and material from said second supply station is transported to said alignment station between transport of lamina at said first supply station to said alignment station.

22. A method as recited in claim 21, including the further steps of self-aligning one of said lamina on a tapered end of said alignment pins, and pressing said one of said lamina over said alignment pins with a head carried by said head transport assembly.

* * * * *